(12) United States Patent
Hesterman

(10) Patent No.: US 11,162,988 B2
(45) Date of Patent: Nov. 2, 2021

(54) LOAD IMPEDANCE TESTER AND MEASUREMENT METHOD

(71) Applicant: Aerojet Rocketdyne, Inc., Sacramento, CA (US)

(72) Inventor: Bryce L. Hesterman, Sacramento, CA (US)

(73) Assignee: Aerojet Rocketdyne, Inc., Redmond, WA (US)

( * ) Notice: Subject to any disclaimer, the term of this patent is extended or adjusted under 35 U.S.C. 154(b) by 43 days.

(21) Appl. No.: 16/768,472

(22) PCT Filed: Dec. 4, 2017

(86) PCT No.: PCT/US2017/064452
§ 371 (c)(1),
(2) Date: May 29, 2020

(87) PCT Pub. No.: WO2019/112549
PCT Pub. Date: Jun. 13, 2019

(65) Prior Publication Data
US 2020/0386798 A1    Dec. 10, 2020

(51) Int. Cl.
*G01R 27/02* (2006.01)
*F03H 1/00* (2006.01)
*G01R 19/00* (2006.01)
*G05F 1/613* (2006.01)

(52) U.S. Cl.
CPC ........... *G01R 27/02* (2013.01); *F03H 1/0087* (2013.01); *G01R 19/0084* (2013.01); *G01R 19/0092* (2013.01); *G05F 1/613* (2013.01)

(58) Field of Classification Search
CPC ............... G01R 27/02; G01R 19/0084; G01R 19/0092; F03H 1/0087; G05F 1/613
USPC ......................................... 324/600, 609, 667
See application file for complete search history.

(56) References Cited

U.S. PATENT DOCUMENTS

| 4,720,668 A | 1/1988 | Lee et al. |
| 9,689,827 B2 * | 6/2017 | Pratt ..................... G01N 27/404 |
| 2002/0033796 A1 * | 3/2002 | Chatenet ................. F16C 11/12 345/156 |

(Continued)

FOREIGN PATENT DOCUMENTS

| WO | 0058992 | 1/2002 |
| WO | 2017005665 | 1/2017 |

OTHER PUBLICATIONS

International Preliminary Report on Patentability for Application No. PCT/US2017/064452 dated Jun. 18, 2020.

(Continued)

*Primary Examiner* — Giovanni Astacio-Oquendo

(57) ABSTRACT

An impedance measurement circuit includes a signal injector having a voltage input and a voltage output, a controllable switch, and a voltage drop device connected in parallel with the controllable switch between the voltage input and the voltage output. The voltage output is connected to a load. A voltage sensor is configured to measure a voltage across the load. A current sensor is configured to measure a current draw of the load. A computing device is configured to determine an impedance of the load at a frequency based on the measured voltage and the measured current. The computing device controls the switch based on the frequency.

17 Claims, 2 Drawing Sheets

(56) References Cited

U.S. PATENT DOCUMENTS

| | | | | |
|---|---|---|---|---|
| 2012/0326723 | A1* | 12/2012 | Bloemenkamp | G01V 3/24 |
| | | | | 324/356 |
| 2013/0043121 | A1* | 2/2013 | Anders | H01J 37/3467 |
| | | | | 204/192.12 |
| 2014/0225634 | A1* | 8/2014 | Broillet | G01P 21/00 |
| | | | | 324/750.01 |
| 2015/0002168 | A1* | 1/2015 | Kao | A61B 5/4875 |
| | | | | 324/600 |
| 2015/0013646 | A1* | 1/2015 | Qi | G01F 23/2962 |
| | | | | 123/478 |
| 2015/0231340 | A1* | 8/2015 | Pumphrey | G01N 27/223 |
| | | | | 128/200.16 |
| 2015/0372631 | A1 | 12/2015 | Fedigan et al. | |
| 2016/0116516 | A1* | 4/2016 | Xia | G01R 27/00 |
| | | | | 324/609 |
| 2017/0244337 | A1 | 8/2017 | Kitamoto | |

OTHER PUBLICATIONS

Brady, M.E. and G. Aston, Pulsed Plasma Thruster Ignitor Plug Ignition Characteristics, Journal of Spacecraft and Rockets, Sep. 1983, vol. 20, No. 5, p. 450.

Hutsel, B.T., et al., Isolated Power Supply for Self-Neutralization Tests of a Ferroelectric Plasma Thruster, 2009 IEEE Pulsed Power Conference, p. 1108-1111.

International Search Report and Written Opinion for International Application No. PCT/US2017/064452 dated Aug. 10, 2018.

\* cited by examiner

LOAD IMPEDANCE TESTER AND MEASUREMENT METHOD

STATEMENT REGARDING FEDERALLY SPONSORED RESEARCH OR DEVELOPMENT

This invention was made with government support under contract number NNC16CA21C awarded by NASA. The government has certain rights in the invention.

CROSS-REFERENCE TO RELATED APPLICATION

This application claims priority to International Patent Application No. PCT/US2017/64452 filed on Dec. 4, 2017.

TECHNICAL FIELD

The present disclosure relates generally to impedance testing, and more specifically to a circuit for determining an impedance of a load.

BACKGROUND

Certain electrical loads, such as plasma thrusters and the like, are calibrated and controlled based at least partially on a measured impedance of the load. For the plasma thruster example, existing systems have attempted to determine impedance by injecting a current from a power amplifier into the electrical load and measuring the change in load characteristics. Plasma thrusters, and other loads exhibiting similar characteristics, can generate current draws that include large current fluctuations. The large current fluctuations are referred to as breathing mode currents, and typically occur at rates of several to tens of kHz.

When current injection is performed using a series injection transformer, the corresponding power amplifier is required to handle a breathing mode current whose magnitude can overload the power amplifier. Also, in some examples, the leakage inductance of the injection transformer itself can create too much impedance for the plasma to operate in a stable manner, resulting in a poor impedance reading of the plasma thruster.

Alternative examples have attempted to determine the impedance using a parallel injection transformer with a current perturbation being injected through a capacitor. In such configurations, the breathing mode current is reduced, but the low impedance of the corresponding power source soaks up the injected current from the amplifier resulting in an inability to accurately measure the impedance of the plasma thruster.

SUMMARY OF THE INVENTION

In one exemplary embodiment an impedance measurement circuit includes a signal injector having a voltage input and a voltage output, a controllable switch, and a voltage drop device connected in parallel with the controllable switch between the voltage input and the voltage output, the voltage output being connected to a load, a voltage sensor configured to measure a voltage across the load, a current sensor configured to measure a current draw of the load, and a computing device configured to determine an impedance of the load at a frequency, wherein the impedance is based on the measured voltage and the measured current, the computing device controlling the switch based on the frequency.

In another example of the above described impedance measurement circuit the voltage drop device includes a diode.

In another example of any of the above described impedance measurement circuits the signal injector further includes at least one voltage drop device connecting the voltage input to the voltage output, and a switch connected in parallel to the at least one voltage drop device such that the voltage drop device is short circuited while the switch is closed.

Another example of any of the above described impedance measurement circuits further includes a gate driver connected to a control input of the switch.

In another example of any of the above described impedance measurement circuits the at least one voltage drop device is a plurality of voltage drop devices.

In another example of any of the above described impedance measurement circuits the plurality of voltage drop devices comprises a plurality of serially connected diodes.

In another example of any of the above described impedance measurement circuits the plurality of serially connected diodes are approximately identical.

In another example of any of the above described impedance measurement circuits the plurality of serially connected diodes includes at least two sets of substantially distinct diodes.

In another example of any of the above described impedance measurement circuits a voltage drop across the at least one voltage drop device is at most three percent of an expected voltage at the voltage output.

In another example of any of the above described impedance measurement circuits the voltage drop across the at least one voltage drop device is between one and three percent of the expected voltage at the voltage output.

In another example of any of the above described impedance measurement circuits the load is a plasma thruster.

In another example of any of the above described impedance measurement circuits the voltage input is connected to a stiff voltage source.

An exemplary method for determining an impedance of a load includes providing a voltage from a voltage source to a load, injecting an approximately square wave perturbation into the voltage, measuring a current draw of the load and a voltage across the load, and provided the measurements to a computing device, analyzing a voltage across the load and the current draw of the load using the computing device, and thereby determining an impedance of the load.

In another example of the above described exemplary method for determining an impedance of a load analyzing the voltage across the load and the current draw of the load comprises determining a ratio of a fundamental component of the voltage divided by a fundamental component of the current draw.

In another example of any of the above described exemplary methods for determining an impedance of a load the computing device extracts the fundamental component of the voltage from the analyzed voltage using a Fourier transform.

In another example of any of the above described exemplary methods for determining an impedance of a load the computing device extracts the fundamental component of the current from the analyzed current draw using a Fourier transform.

In another example of any of the above described exemplary methods for determining an impedance of a load injecting an approximately square wave perturbation into the voltage comprises alternating between passing the voltage through a voltage drop device and bypassing the voltage drop device, the alternation occurring at a set frequency.

In another example of any of the above described exemplary methods for determining an impedance of a load passing the voltage through a voltage drop device, comprises passing the voltage through a plurality of series connected diodes.

In another example of any of the above described exemplary methods for determining an impedance of a load alternating between passing the voltage through the voltage drop device and bypassing the voltage drop device comprises alternating a switch between an open state and a closed state, and wherein the switch completes a short circuit path around the voltage drop device while in the closed state.

These and other features of the present invention can be best understood from the following specification and drawings, the following of which is a brief description.

DETAILED DESCRIPTION OF AN EMBODIMENT

Figure 1:
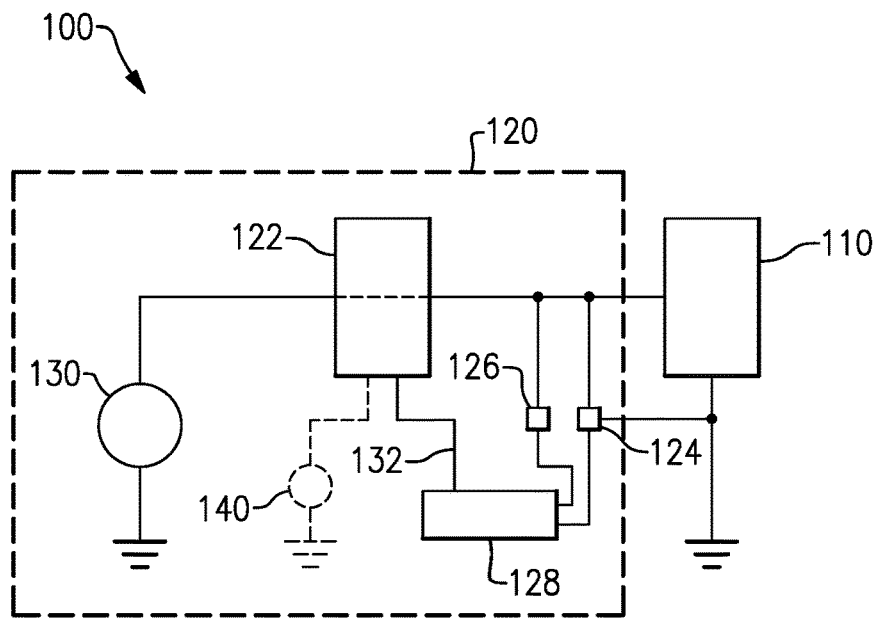
FIG. 1 illustrates an exemplary circuit including a load and a load impedance tester.

FIG. 1 schematically illustrates circuit 100 including a load 110 and a load impedance tester 120 for determining the impedance of the load 110. Included within the impedance tester 120 is a voltage source 130. The voltage source 130 provides an operational voltage to the load 110. As is necessary for certain types of loads 110, such as a plasma thruster, the voltage source 130 is a stiff voltage source. As used herein, a stiff voltage source refers to a voltage source where the output voltage has minimal voltage fluctuation despite a presence of substantial variance in the current drawn from the voltage source.

Connected between the voltage source 130 and the load 110 is a signal injector 122. The signal injector 122 periodically switches the voltage provided by the voltage source 130 from a first voltage level to a second voltage level, in a signal approximating a square wave. As used herein, approximately a square wave refers to any signal exhibiting a substantial similarity to a square wave. In some examples, such a signal is a periodic signal that more closely resembles a square wave than alternative standard waveforms. A voltage sensor 124 is positioned across the load 110 and determines a voltage across the load 110. A current sensor 126 is configured to measure the current draw of the load 110 at an input to the load 110. Both the current sensor 126 and the voltage sensor 124 can be any conventional current sensor configuration and voltage sensor configuration.

Each of the sensors 124, 126 provides the sensed values to a computing device 128, such as a network analyzer. In the illustrated example, the computing device 128 includes a control output 132 connected to the signal injector 122. The control output 132 controls a high/low voltage state of the signal injector 122, thereby creating the approximately square wave signal injection. In alternate examples, an alternate voltage source 140 can be connected to the signal injector 122 and provide the same function.

The impedance of multiple load types can be measured by injecting periodic perturbations on the output voltage of a voltage source, such as the voltage source 130, and measuring the resultant current perturbations. Existing systems typically utilize an injection transformer with a secondary winding connected between the voltage source 130 and the load 110 as described above. Certain load types, such as plasma thrusters, render the perturbation systems utilizing injection transformers unreliable.

In order to reliably generate perturbations in conjunction with a plasma thruster, or similar load 110, during operation, the impedance tester 120 outputs a stiff voltage from the voltage source 130, and the signal injector 122 periodically alternates from a high voltage to a low voltage, thereby imparting an approximately square wave perturbation on the voltage signal driving the load 110. In one example, the approximately square wave perturbation has a scale that is at least two orders of magnitude smaller than the drive voltage output from the voltage source 130. By way of example, if the drive voltage output from the voltage source 130 is 500V, an exemplary perturbation magnitude could be approximately 5V. The perturbed voltage is then provided to the load 110.

The computing device 128 analyzes the voltage across the load 110 and the current draw of the load 110 using the sensors 124, 126 and determines the impedance of the load 110 based on the sensed values. The impedance at a particular operating frequency is equal to the ratio of the fundamental component of the voltage divided by the fundamental component of the current. This value is typically expressed in ohms ($\Omega$) as either a magnitude and a phase angle, or as a complex quantity with real and imaginary parts. The computing device 128 mathematically analyzes the waveforms of the voltage and current signals detected by the sensors 124, 126 using a Fourier transform to extract the fundamental components. The fundamental components are then divided to determine the aforementioned ratio.

The sensed voltage and current signals contain harmonic components at harmonic frequencies that are integer multiples of the perturbation frequency because the signal injector 122 produces a perturbation voltage having a substantially square waveform. In an alternate example, the computing device may determine the load impedance at a harmonic frequency using Fourier transform components of the measured voltage and current for frequencies other than the fundamental frequency by dividing the voltage and current components at a harmonic frequency to obtain the impedance at that harmonic frequency.

In some further examples, the voltage and current signals from the sensors 124, 126 can be filtered using two-channel low-pass filters having matched characteristics before they are analyzed to increase the accuracy of the results. Such filtering is particularly desirable if the voltage and current waveforms produced by the sensors 124, 126 include a substantial amount of electronic noise and can be accomplished via an input filter at the computing device 128.

Figure 2:
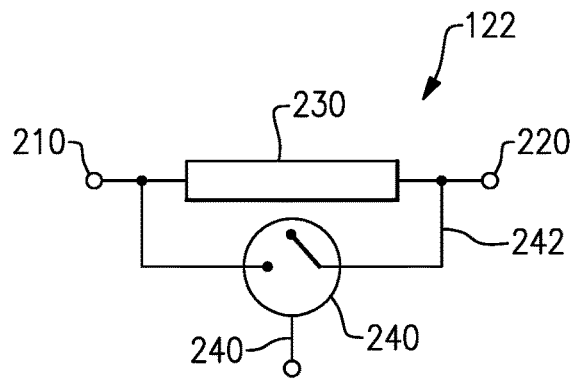
FIG. 2 schematically illustrates an exemplary signal injector for utilization in the example of FIG. 1.

With continued reference to FIG. 1, FIG. 2 schematically illustrates an exemplary signal injector 122 according to a first example. The signal injector 122 includes an input node 210 configured to be connected to the stiff voltage source 130. An output node 220 is configured to be connected to the load 110. Connected serially between the input node 210 and the output node 220 is a voltage drop device 230. The voltage drop device 230 can be any electrical device that generates a comparatively small voltage drop, relative to the output voltage of the stiff voltage source 130. By way of example, the comparatively small voltage drop can be at most three percent of the output voltage in some examples. In other examples, the comparatively small voltage drop can be between one percent and three percent of the output voltage. In some examples, the voltage drop device 230 is a device that provides a relatively constant voltage reduction independent of the current passing across the voltage drop device 230.

In parallel with the voltage drop device 230 is an electrical switch 240. The electrical switch 240 is configured to operate in at least an open state and a closed state. While in the open state, a parallel circuit path 242 including the electrical switch 240 is broken, and the voltage from the voltage source 130 passes through the voltage drop device 230, resulting in a decreased voltage at the output node 220. When the electrical switch 240 is in a closed state, the parallel circuit path 242 conducts electricity, and the voltage drop device 230 is short circuited.

The electrical switch 240 includes a control input 244 connected to the computing device 128, with the voltage at the control input 244 determining the open/closed state of the electrical switch 240. By cycling the electrical switch 240 between the open state and the closed state at a known frequency, a voltage at the output node 220 is generated with the approximately square wave perturbation added to the drive voltage from the voltage source 130. As the frequency of the approximately square wave is directly controlled by the output signals of the computing device 128, the computing device 128 determines the impedance of the connected load 110 at that frequency based on the sensed voltage and current.

Figure 3:
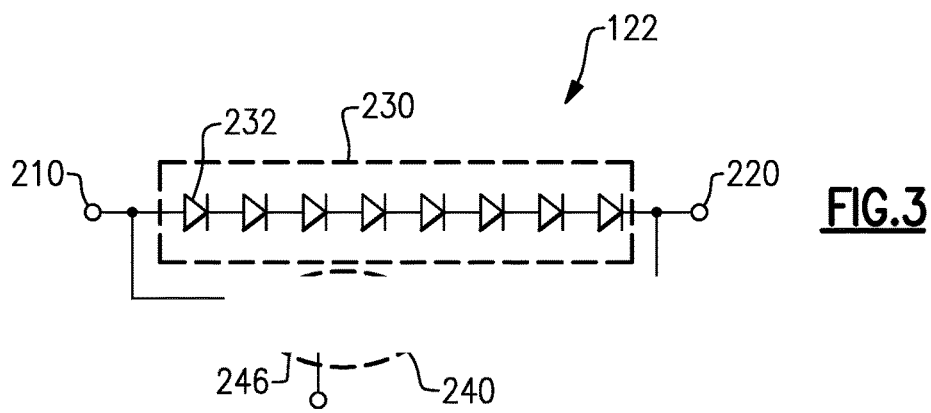
FIG. 3 schematically illustrates a detailed example signal injector such as could be used as the signal injector of FIG. 2.
Figure 4:
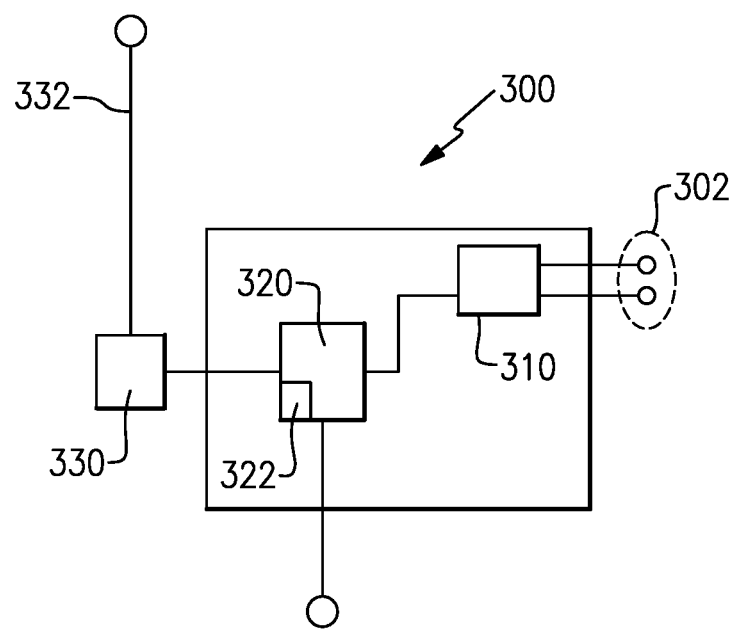
FIG. 4 schematically illustrates an exemplary impedance analyzer.

With further reference to FIG. 2, one specific exemplary signal injector 122 is illustrated in the example of FIG. 3. In the specific example, the voltage drop device 230 is a series-connected string of diodes 232. Each diode 232 produces a relatively constant voltage drop across the diode 232 when a load current flows through it. By placing the diodes 232 in series a small, controlled, voltage drop is introduced across the voltage drop device 230. Further, the voltage drop across each diode 232 is relatively independent of the current passing through the diode 232 compared to a resistor for which the voltage across it is proportional to the current through it. For this reason diodes 232, and similar electronics, are particularly suited for the voltage drop device 230 in some embodiments.

In alternative examples, a resistor could be used to implement the voltage drop device 230. In such examples, the resistance could require adjustment to accommodate various levels of load currents, and the resistance would be kept appropriately small in value to ensure stability of the load.

In the illustrated embodiment of FIG. 3, each diode 232 is approximately identical. As used herein, approximately identical refers to diodes 232 having the same specification, and can allow for some minor differences due to manufacturing variance. In alternative examples, the diodes 232 can be varied to generate a specific desired voltage drop across the voltage drop device 230. A MOSFET 246 is connected to the control input 244, and is controlled by the computing device 128, to operate as the switch 240.

With continued reference to FIGS. 1-3, FIG. 4 schematically illustrates an exemplary computing device 300, such as the computing device 128 illustrated in FIG. 1. The exemplary computing device 300 includes inputs 302 configured to receive the sensed voltage and current from the voltage sensor 124 and the current sensor 126 respectively. Each of the inputs 302 is connected to a filter 310. In one example the filter 310 includes a pair of two-channel low-pass filters having matched characteristics. The filtered sensor signals are provided to a processor 320 and a memory 322. The memory 322 stores instructions for causing the processor 320 to analyze the sensor signals according to any known signal analysis technique and thereby determine the impedance of the connected load based on signals from the inputs 302.

Also included connected to the computing device 300 is a gate driver circuit 330. In the illustrated example, the gate driver circuit 330 is external to the computing device 300 and provides voltage isolation between computing device 300 and voltage drop device 122. The gate driver circuit 330 is connected to the processor 320, and outputs a gate control signal 332. The value of the gate control signal 332 is controlled by the processor 320, and controls the on/off state of the switch 240, illustrated in FIGS. 2 and 3. In the example of FIG. 3, because the gate control signal 322 is generated by the computing device 300, the processor 320 inherently knows the frequency of the square wave injection. In alternative examples, where the square wave injection is originated from another source, such as the alternate voltage source 140, additional inputs can be provided to the processor 320, thereby facilitating the analysis.

While described and illustrated above within the context of determining an impedance of a plasma thruster, it should be appreciated that the above described methods and devices can be utilized to detect the impedance of any type of load and is not limited to plasma thruster loads, or loads including plasma thrusters.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:
1. An impedance measurement circuit comprising:
  a signal injector having a voltage input and a voltage output, a controllable switch, and a first voltage drop device connected in parallel with the controllable switch between the voltage input and the voltage output, the voltage output being connected to a load at least one second voltage drop device connecting the voltage input to the voltage output, and a switch connected in parallel to said at least one second voltage drop device such that said at least one second voltage drop device is short circuited while the switch is closed;
  a voltage sensor configured to measure a voltage across the load;
  a current sensor configured to measure a current draw of the load; and
  a computing device configured to determine an impedance of the load at a frequency, wherein the impedance is based on the measured voltage and the measured current, the computing device controlling the switch based on the frequency.
2. The impedance measurement circuit of claim 1, wherein the first voltage drop device includes a diode.
3. The impedance measurement circuit of claim 1, further comprising a gate driver connected to a control input of the switch.

4. The impedance measurement circuit of claim 1, wherein the at least one second voltage drop device is a plurality of second voltage drop devices.

5. The impedance measurement circuit of claim 4, wherein the plurality of second voltage drop devices comprises a plurality of serially connected diodes.

6. The impedance measurement circuit of claim 5, wherein the plurality of serially connected diodes are approximately identical.

7. The impedance measurement circuit of claim 5, wherein the plurality of serially connected diodes includes at least two sets of substantially distinct diodes.

8. The impedance measurement circuit of claim 1, wherein a voltage drop across said at least one second voltage drop device is at most three percent of an expected voltage at the voltage output.

9. The impedance measurement circuit of claim 8, wherein the voltage drop across the at least one second voltage drop device is between one and three percent of the expected voltage at the voltage output.

10. The impedance measurement circuit of claim 1, wherein the load is a plasma thruster.

11. The impedance measurement circuit of claim 1, wherein the voltage input is connected to a stiff voltage source.

12. A method for determining an impedance of a load comprising:
providing a voltage from a voltage source to the load;
injecting an approximately square wave perturbation into the voltage;
measuring a current draw of the load and a voltage across the load, and provided the measurements to a computing device;
analyzing a voltage across the load and the current draw of the load by determining a ratio of a fundamental component of the voltage divided by a fundamental component of the current draw using the computing device, and thereby determining an impedance of the load.

13. The method of claim 12, wherein the computing device extracts the fundamental component of the voltage from the analyzed voltage using a Fourier transform.

14. The method of claim 12, wherein the computing device extracts the fundamental component of the current from the analyzed current draw using a Fourier transform.

15. A method for determining an impedance of a load comprising:
providing a voltage from a voltage source to the load;
injecting an approximately square wave perturbation into the voltage by alternating between passing the voltage through a voltage drop device and bypassing the voltage drop device, the alternation occurring at a set frequency;
measuring a current draw of the load and a voltage across the load, and provided the measurements to a computing device;
analyzing a voltage across the load and the current draw of the load using the computing device, and thereby determining an impedance of the load.

16. The method of claim 15, wherein passing the voltage through a voltage drop device, comprises passing the voltage through a plurality of series connected diodes.

17. The method of claim 15, wherein alternating between passing the voltage through the voltage drop device and bypassing the voltage drop device comprises alternating a switch between an open state and a closed state, and wherein the switch completes a short circuit path around the voltage drop device while in the closed state.

* * * * *